United States Patent
Chiang et al.

(10) Patent No.: US 7,655,990 B2
(45) Date of Patent: Feb. 2, 2010

(54) VOLTAGE-CLIPPING DEVICE WITH HIGH BREAKDOWN VOLTAGE

(75) Inventors: Chiu-Chih Chiang, Hsinchu (TW); Chih-Feng Huang, Hsinchu (TW); You-Kuo Wu, Taipei (TW); Long Shih Lin, Hsinchu (TW)

(73) Assignee: System General Corp., Taipei Hsien (TW)

( * ) Notice: Subject to any disclaimer, the term of this patent is extended or adjusted under 35 U.S.C. 154(b) by 582 days.

(21) Appl. No.: 11/424,530

(22) Filed: Jun. 15, 2006

(65) Prior Publication Data
US 2007/0290276 A1 Dec. 20, 2007

(51) Int. Cl.
*H01L 29/94* (2006.01)

(52) U.S. Cl. .................. 257/402; 257/403; 257/404
(58) Field of Classification Search ......... 257/402–404; 438/217, 289; 327/180, 309, 321
See application file for complete search history.

(56) References Cited

U.S. PATENT DOCUMENTS 6,015,999 A * 1/2000 Yu et al. ............... 257/497

FOREIGN PATENT DOCUMENTS

JP  57-128979  8/1982

* cited by examiner

*Primary Examiner*—Thinh T Nguyen
(74) *Attorney, Agent, or Firm*—Jianq Chyun IP Office

(57) ABSTRACT

The present invention proposes a voltage-clipping device utilizing a pinch-off mechanism formed by two depletion boundaries. A clipping voltage of the voltage-clipping device can be adjusted in response to a gate voltage; a gap of a quasi-linked well; and a doping concentration and a depth of the quasi-linked well and a well with complementary doping polarity to the quasi-linked well. The voltage-clipping device can be integrated within a semiconductor device as a voltage stepping down device in a tiny size, compared to traditional transformers.

18 Claims, 3 Drawing Sheets

VOLTAGE-CLIPPING DEVICE WITH HIGH BREAKDOWN VOLTAGE

BACKGROUND OF THE INVENTION

1. Field of the Invention

The present invention relates to a semiconductor manufacturing process, more particularly, the present invention relates to a voltage stepping down device manufacturing process.

2. Description of Related Art

In traditional arts, stepping down a higher voltage potential to a lower voltage potential is well known to the industrial fields. Voltage stepping down devices, such as voltage dividers and transformers, are widely used to supply a predetermined voltage potential to electronic systems. A transformer includes plural coupled coils having proportional turn numbers to each other for achieving voltage stepping down. However, transformers are generally huge in size and cannot be easily integrated within semiconductor devices. Therefore, higher manufacturing cost and huge space occupation are their inevitable disadvantages.

Voltage dividers formed with resistors generally suffer from resistance variation problems. Temperature dependence of resistors lowers the precision of the voltage potential supplied by voltage dividers. Moreover, the power consumption caused by resistors is another issue to be concerned. In general-purpose applications, when a constant voltage source is needed in an electronic circuit, a device capable of supplying stable voltage potential with lesser die space occupation and lower power consumption is especially desired by the industrial filed.

SUMMARY OF THE INVENTION

The present invention proposes a voltage-clipping device utilizing a pinch-off mechanism formed by two depletion boundaries. A clipping voltage of the voltage-clipping device can be adjusted in response to a gate voltage; a gap of a quasi-linked well; and a doping concentration and a depth of the quasi-linked well and a well/body with complementary doping polarity to the quasi-linked well. The voltage-clipping device has a tiny size and can be integrated within a semiconductor device as a voltage stepping down device.

The quasi-linked well is formed by controlling a distance between two adjacent wells. A middle-doped region with different doping concentration from the two adjacent wells is formed between the two adjacent wells.

The middle-doped region associates with complementary doped regions complementary to the quasi-linked well for forming two depletion boundaries. The two depletion boundaries are varied in response to the gate voltage and voltage potentials applied to the quasi-linked well. Variations of resistance, voltage and current of the quasi-linked well are controlled by the two depletion boundaries and voltage potentials applied to the quasi-linked well.

It is to be understood that both the foregoing general descriptions and the following detailed descriptions are exemplary, and are intended to provide further explanation of the invention as claimed. Still further objects and advantages will become apparent from a consideration of the ensuing description and drawings.

BRIEF DESCRIPTION OF THE DRAWINGS

The accompanying drawings are included to provide further understanding of the invention, and are incorporated into and constitute a part of this specification. The drawings illustrate embodiments of the invention and, together with the description, serve to explain the principles of the invention.

DETAILED DESCRIPTION OF THE INVENTION

Figure 1:
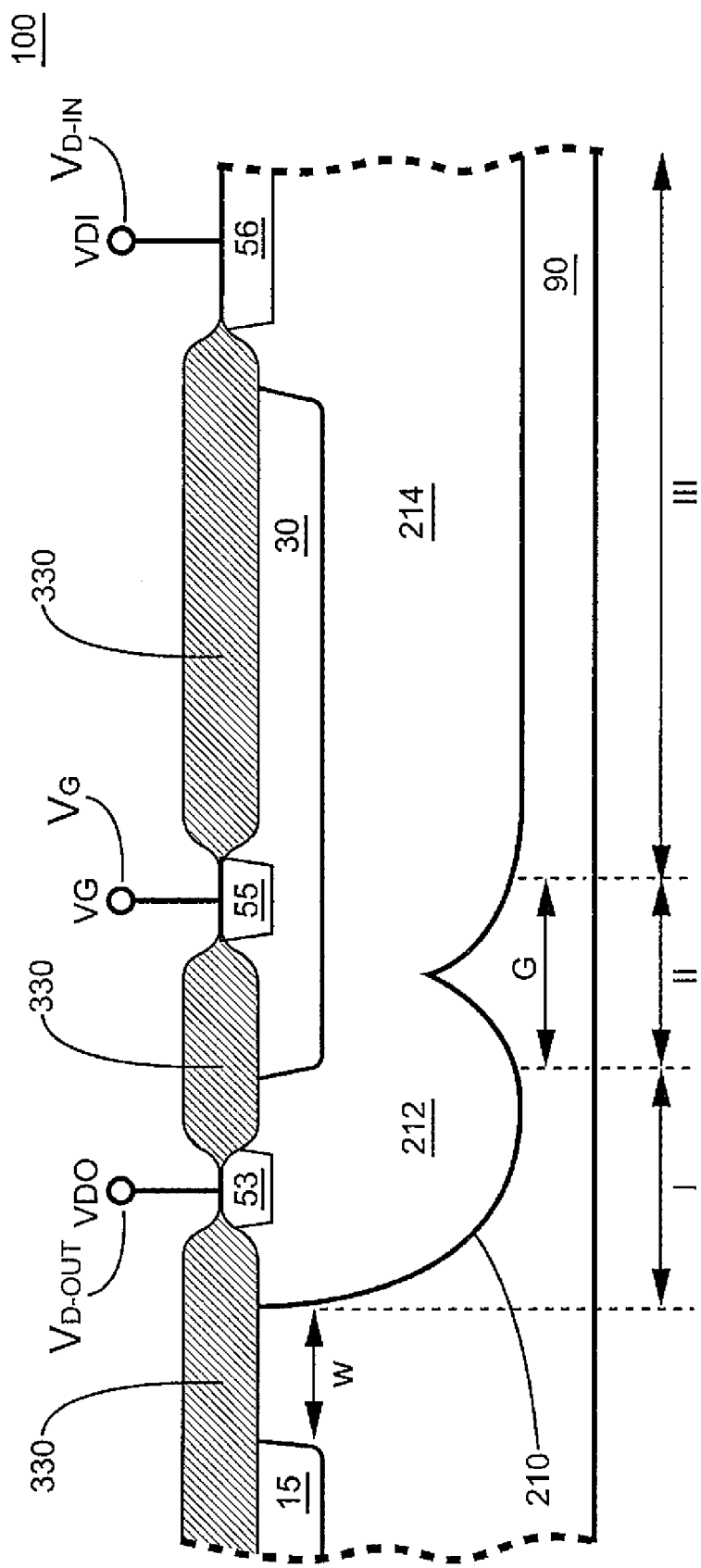
FIG. 1 shows a cross-sectional view of a voltage-clipping device according to a preferred embodiment of the present invention.

FIG. 1 shows a cross-sectional view of a voltage-clipping device 100 according to an embodiment of the present invention. The voltage-clipping device 100 comprises a P-type substrate 90 with resistivity ranging from 10 ohm-cm to 100 ohm-cm. As shown in FIG. 1, a quasi-linked N-type well 210 is formed by two adjacent N-type wells 212 and 214 in the P-type substrate 90 featuring a gap with a width G therebetween. With the gap, a discontinuous ion-doping region is formed in a middle-doped region II. The discontinuous ion-doping region is parallel to a surface of the P-type substrate 90. The equivalent doping concentration of the middle-doped region II is slighter than regions I and III.

The doping concentration of the quasi-linked N-type well 210 ranges from $1.7E17/cm^3$ to $8.3E18/cm^3$. The depth of the quasi-linked N-type well 210 ranges from 2 μm to 10 μm. The width G of the gap required for the quasi-linked N-type well 210, for example, ranges between 0 μm and 20 μm.

A P-type well (or a P-type body) 30 with P-type conductive ions is formed in the quasi-linked N-type well 210. The doping concentration of the P-type well 30 ranges from $3.3E17/cm^3$ to $1E19/cm^3$. The depth of the P-type well 30 ranges from 1 μm to 5 μm.

A gate region 55 with P+-type conductive ions forms a gate terminal VG of the voltage-clipping device 100. The gate region 55 is disposed in the P-type well 30. An input region 56 with N+-type conductive ions forms an input terminal VDI of the voltage-clipping device 100. An output region 53 with N+-type conductive ions forms an output terminal VDO of the voltage-clipping device 100. The input region 56, the output region 53 and the gate region 55 of the voltage-clipping device 100 are doped with a higher ion concentration than the quasi-linked N-type well 210, for example, ranging from $1E22/cm^3$ to $5E23/cm^3$. The input region 56 and the output region 53 are disposed in the quasi-linked N-type well 210. A field oxide layer 330 is formed for serving as isolation structures.

Figure 2:
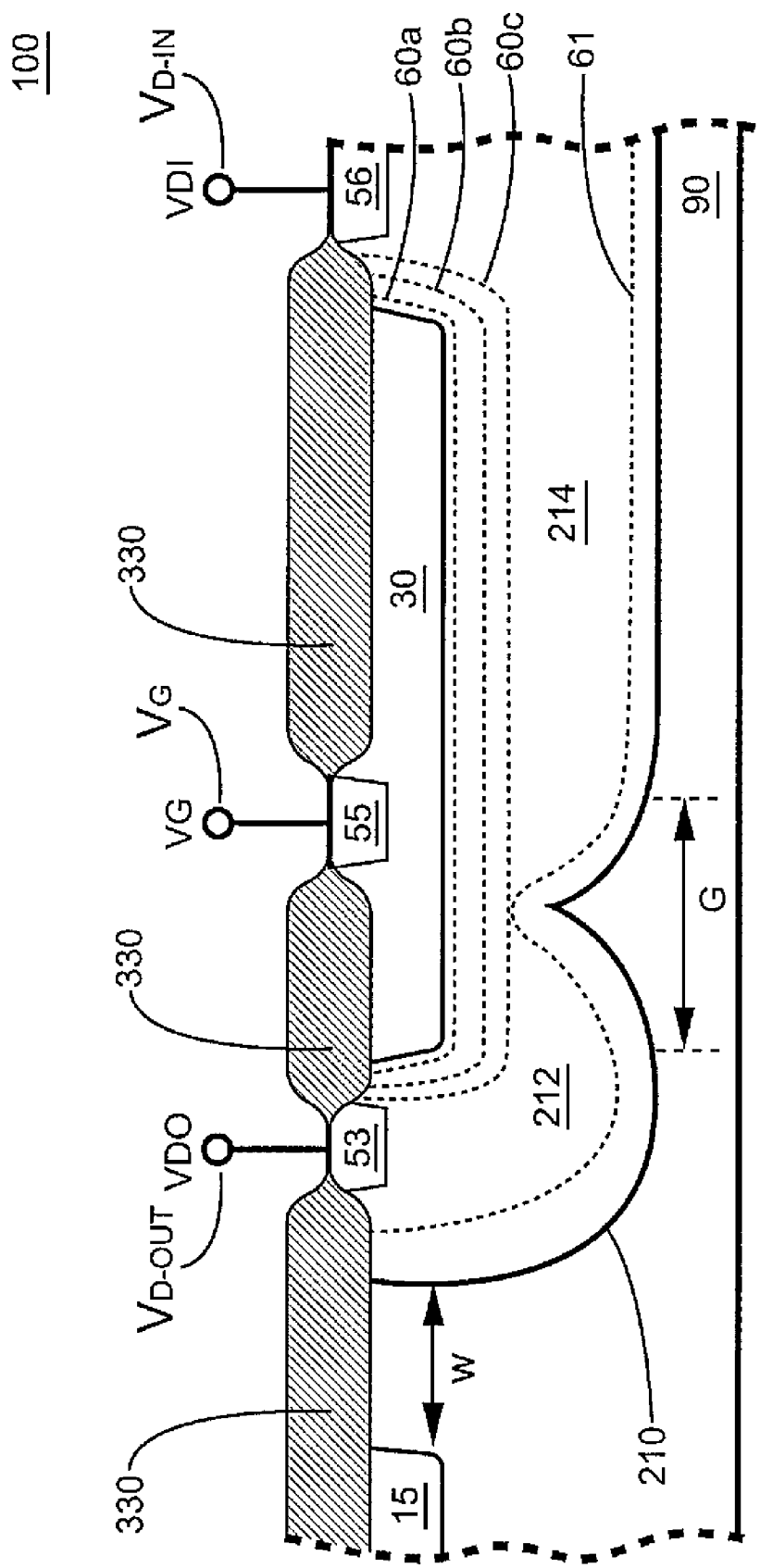
FIG. 2 shows two depletion boundaries of voltage-clipping device under different gate-voltage potentials according to an embodiment of the present invention.

Referring to FIG. 2, when an input voltage $V_{D-IN}$ with a positive-voltage potential is applied at the input terminal VDI of the voltage-clipping device 100, an output voltage $V_{D-OUT}$ will be generated at the output terminal VDO of the voltage-clipping device 100 via the conduction of the quasi-linked N-type well 210. The output voltage $V_{D-OUT}$ is then varied in linear proportion to the input voltage $V_{D-IN}$. The input voltage $V_{D-IN}$ and the output voltage $V_{D-OUT}$ result in a first depletion boundary 61 following a geometric shape of the quasi-linked N-type well 210.

When a gate-voltage potential $V_G$ is applied at the gate terminal VG of the voltage-clipping device 100, a second depletion boundary is generated accordingly. Referring to FIG. 2, when the gate terminal VG is applied with a zero-voltage potential, the second depletion boundary is shown along a dotted line 60b. When the gate terminal VG is floated or applied with a positive-voltage potential, the second depletion boundary is shown along a dotted line 60a. When the gate terminal VG is applied with a negative-voltage potential, the second depletion boundary is shown along a dotted line 60c.

Figure 3:
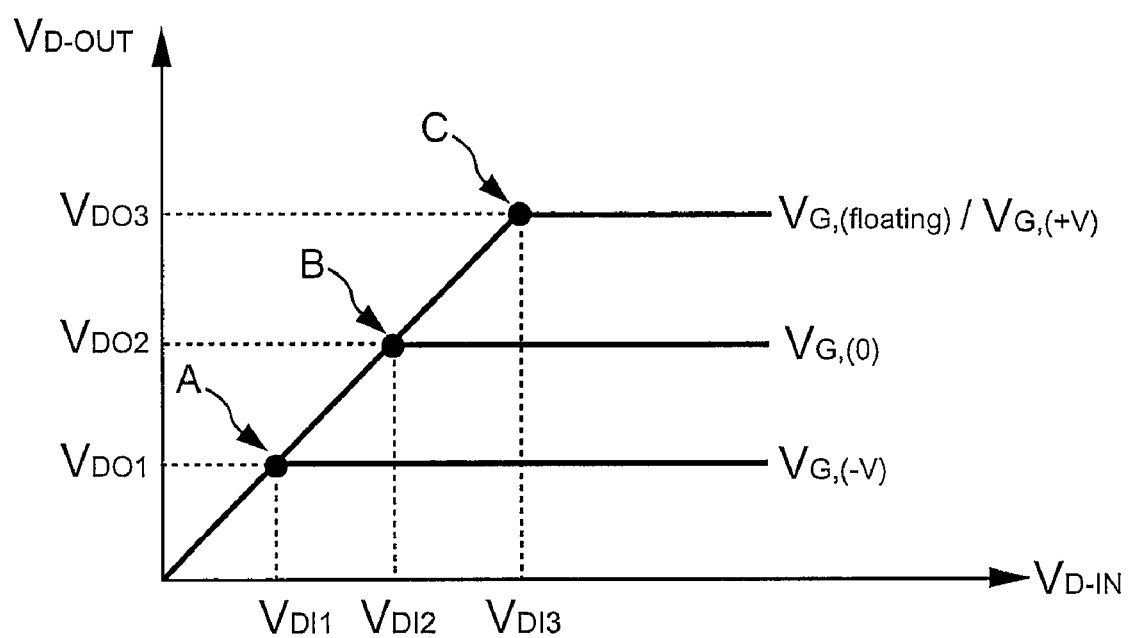
FIG. 3 shows a characteristic property of an input voltage and an output voltage under different gate-voltage potential applied to the voltage-clipping device according to an embodiment of the present invention.

Referring to FIG. 2 and FIG. 3, when the gate terminal VG is applied with a negative-voltage potential, as the input voltage $V_{D-IN}$ increases, the first depletion boundary 61 will continuously approach to the second depletion boundary. When the first depletion boundary 61 and the second depletion boundary, as shown in dotted line 60c, pinch off, the conduction path between the input terminal VDI and the output terminal VDO is cut off. Therefore, the output voltage $V_{D-OUT}$ is clipped at the same voltage potential as the input voltage $V_{D-IN}$ when the first depletion boundary 61 and the second depletion boundary pinch off.

FIG. 3 shows the characteristic property of the input voltage $V_{D-IN}$ and the output voltage $V_{D-OUT}$ according to an embodiment of the present invention. When a negative-voltage potential is applied to the gate terminal VG, the output voltage $V_{D-OUT}$ will be clipped at an output voltage potential $V_{DO1}$, which is equal to an input voltage potential $V_{DI1}$ when the two depletion boundaries pinch off (as shown in point A). When the gate terminal VG is applied with a zero-voltage potential, the output voltage $V_{D-OUT}$ will be clipped at an output voltage potential $V_{DO2}$, which is equal to an input voltage potential $V_{DI2}$ when the two depletion boundaries pinch off (as shown in point B). When the gate terminal VG is floated or applied with a positive voltage, the output voltage $V_{D-OUT}$ will be clipped at an output voltage potential $V_{DO3}$, which is equal to an input voltage potential $V_{DI3}$ when the two depletion boundaries pinch off (as shown in point C). Voltage potentials $V_{DI1}$, $V_{DI2}$, $V_{DI3}$, $V_{DO1}$, $V_{DO2}$, and $V_{DO3}$ can be expressed by following inequalities:

$$V_{DI1} < V_{DI2} < V_{DI3} \quad (1)$$

$$V_{DO1} < V_{DO2} < V_{DO3} \quad (2)$$

In addition, the gap having the width G for the quasi-linked N-type well 210 facilitates to pinch off the connection path between the input terminal VDI and the output terminal VDO of the voltage-clipping device 100.

Referring to FIG. 2, the voltage-clipping device 100 further comprises a fringe P-type well 15. The fringe P-type well 15 is disposed adjacent to the quasi-linked N-type well in a distance w. The distance w is adjusted to increase a breakdown voltage of the voltage-clipping device 100.

According to the present invention, the output voltage $V_{D-OUT}$ of the voltage-clipping device 100 is controlled to be clipped at a predetermined voltage potential, which can be applied as a tiny voltage stepping down device in the semiconductor device. In general-purpose application, the present invention supplies a cost-effective and an accurate voltage stepping down device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
   a substrate of a first conductive type;
   a quasi-linked well of a second conductive type having the a first depletion boundary disposed in the substrate, wherein the quasi-linked well is formed by two adjacent wells having a gap with a width therebetween;
   a first well of the first conductive type having the a second depletion boundary disposed in the quasi-linked well;
   a first heavily doped region of the first conductive type disposed in the first well;
   a second heavily doped region of the second conductive type disposed in the quasi-linked well outside a first side of the first well;
   a third heavily doped region of the second conductive type disposed in the quasi-linked well outside a second side of the first well; and
   an isolation layer disposed over the quasi-linked well and the first well, and between the first heavily doped region and the second heavily doped region and between the first heavily doped region and the third heavily doped region;
   wherein the first depletion boundary of the quasi-linked well and the depletion boundary of the first well is modulated according to voltage variations, and a maximum output-voltage potential at an output terminal of said semiconductor device is controlled by a control-voltage potential.

2. The semiconductor device as claimed in claim 1, wherein said quasi-linked well comprises a discontinuous ion-doping region parallel to a surface of said semiconductor device, and said discontinuous ion-doping region contains said gap.

3. The semiconductor device as claimed in claim 2, wherein said maximum output-voltage potential is correlated with a width of said gap in said discontinuous doping region of said well.

4. The semiconductor device as claimed in claim 1, wherein said maximum output-voltage potential is correlated with a doping concentration of said well.

5. The semiconductor device as claimed in claim 1, wherein said maximum output-voltage potential is correlated to a complementary doping region with a complementary doping polarity to said well.

6. A voltage-clipping device, comprising an input terminal, an output terminal, and a control terminal, wherein said input terminal is connected to said out put terminal via a quasi-linked well which is formed by two adjacent wells having a gap with a width therebetween, said control terminal being connected to a control well with complementary doping polarity to said quasi-link well, a region under said quasi-linked well having complementary doping polarity to said quasi-linked well, wherein a voltage potential at said control terminal controls a depletion boundary between said control well and said quasi-linked well for generating a clipping voltage.

7. The voltage-clipping device as claimed in claim 6, wherein a doping concentration of said control well is correlated to said clipping voltage.

8. The voltage-clipping device as claimed in claim 6, wherein said quasi-linked well has a discontinuous ion-doping region in parallel to said control well, and said discontinuous ion-doping region contains said gap.

9. The voltage-clipping device as claimed in claim 8, wherein a size of said discontinuous ion-doping region is correlated to said clipping voltage.

10. The voltage-clipping device as claimed in claim 6, wherein a fringe well with complementary doping polarity to said quasi-linked well encloses said quasi-linked well, wherein said fringe well and said quasi-linked well are not directly connected to each other.

11. The voltage-clipping device as claimed in claim 6, wherein an output-voltage potential at said output terminal varies in response to an input-voltage potential at said input terminal, said voltage potential at said control terminal controls said output-voltage potential at said output terminal to be clipped at a saturated region.

12. The voltage-clipping device as claimed in claim 6, wherein a doping concentration of said control well ranges from $3.3E17/cm^3$ to $1E19/cm^3$.

13. The voltage-clipping device as claimed in claim 6, wherein a doping concentration of said quasi-linked well ranges from $1.7E17/cm^3$ to $8.3E18/cm^3$.

14. The voltage-clipping device as claimed in claim 6, wherein a depth of said quasi-linked well ranges from 2 μm to 10 μm.

15. The voltage-clipping device as claimed in claim 6, wherein a depth of said control well ranges from 1 μm to 5 μm.

16. The voltage-clipping device as claimed in claim 8, wherein a width of said gap in said discontinuous ion-doping region parallel to said control well ranges between 0 μm and 20 μm.

17. The voltage-clipping device as claimed in claim 10, wherein a doping concentration of said fringe well ranges from $3.3E17/cm^3$ to $1E19/cm^3$.

18. The voltage-clipping device as claimed in claim 10, wherein a depth of said fringe well ranges from 1 μm to 5 μm.

* * * * *